United States Patent
DeBrosse et al.

(10) Patent No.: US 9,471,422 B2
(45) Date of Patent: *Oct. 18, 2016

(54) ADAPTIVE ERROR CORRECTION IN A MEMORY SYSTEM

(71) Applicant: INTERNATIONAL BUSINESS MACHINES CORPORATION, Armonk, NY (US)

(72) Inventors: John K. DeBrosse, Colchester, VT (US); Hillery C. Hunter, Chappaqua, NY (US); Charles A. Kilmer, Essex Junction, VT (US); Kyu-hyoun Kim, Mount Kisco, NY (US); Warren E. Maule, Cedar Park, TX (US); Rona Yaari, Red Hook, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/834,469

(22) Filed: Aug. 25, 2015

(65) Prior Publication Data

US 2016/0034350 A1 Feb. 4, 2016

Related U.S. Application Data

(63) Continuation of application No. 14/446,922, filed on Jul. 30, 2014.

(51) Int. Cl.
*G06F 11/10* (2006.01)
*G11C 29/52* (2006.01)
(Continued)

(52) U.S. Cl.
CPC ....... *G06F 11/1068* (2013.01); *G06F 11/1008* (2013.01); *G11C 11/4076* (2013.01); *G11C 29/52* (2013.01); *H03M 13/353* (2013.01); *G11C 2029/0411* (2013.01)

(58) Field of Classification Search
CPC ............... G01R 31/317; G01R 31/318597; G01R 31/318533; G01R 31/318536; G01R 31/3177; G01R 31/318591; G01R 31/31705; G06F 11/267
USPC .................................. 714/764, 774
See application file for complete search history.

(56) References Cited

U.S. PATENT DOCUMENTS 5,909,449 A * 6/1999 So ................ B64C 27/006
714/721
5,931,954 A * 8/1999 Hoshina ............. G06F 11/1407
714/15
(Continued)

OTHER PUBLICATIONS

Jae-Il Han; Young-Man Kim; Jaeyoul Lee, "Achieving energy-efficiency with a next generation NVRAM-based SSD," in Information and Communication Technology Convergence (ICTC), 2014 International Conference on , vol., No., pp. 563-568, Oct. 22-24, 2014.*

(Continued)

*Primary Examiner* — Cynthia Britt
(74) *Attorney, Agent, or Firm* — Cantor Colburn LLP

(57) ABSTRACT

According to one aspect, a method for adaptive error correction in a memory system includes reading data from a memory array of a non-volatile memory device in the memory system. Error correcting logic checks the data for at least one error condition stored in the memory array. Based on determining that the at least one error condition exists, a write-back indicator is asserted by the error correcting logic to request correction of the at least one error condition. Based on determining that the at least one error condition does not exist, accesses of the memory array continue without asserting the write-back indicator.

7 Claims, 7 Drawing Sheets

(51) Int. Cl.
　　*H03M 13/35* (2006.01)
　　*G11C 11/4076* (2006.01)
　　*G11C 29/04* (2006.01)

(56) References Cited

U.S. PATENT DOCUMENTS

| | | | | |
|---|---|---|---|---|
| 8,531,791 | B1* | 9/2013 | Reid | G11B 20/10009 360/31 |
| 9,170,879 | B2* | 10/2015 | Yang | G06F 11/106 |
| 2003/0093744 | A1* | 5/2003 | Leung | G06F 11/1048 714/763 |
| 2008/0133994 | A1* | 6/2008 | Oh | G06F 11/1008 714/746 |
| 2009/0172267 | A1* | 7/2009 | Oribe | G11C 16/3431 711/103 |
| 2009/0323412 | A1* | 12/2009 | Mokhlesi | G11C 11/5642 365/185.02 |
| 2015/0074491 | A1* | 3/2015 | Hoya | H03M 13/05 714/764 |
| 2015/0234706 | A1* | 8/2015 | Alrod | G06F 11/1072 714/704 |

OTHER PUBLICATIONS

Yuhao Wang; Hao Yu; Wei Zhang, "Nonvolatile CBRAM-Crossbar-Based 3-D-Integrated Hybrid Memory for Data Retention," in Very Large Scale Integration (VLSI) Systems, IEEE Transactions on , vol. 22, No. 5, pp. 957-970, May 2014.*

List of IBM Patents or Patent Applications Treated as Related, Aug. 25, 2015, 2 pages.

U.S. Appl. No. 14/446,922, filed Jul. 30, 2014, Entitled: "Adaptive Error Correction in a Memory System," First Named Inventor: John K. DeBrosse.

* cited by examiner

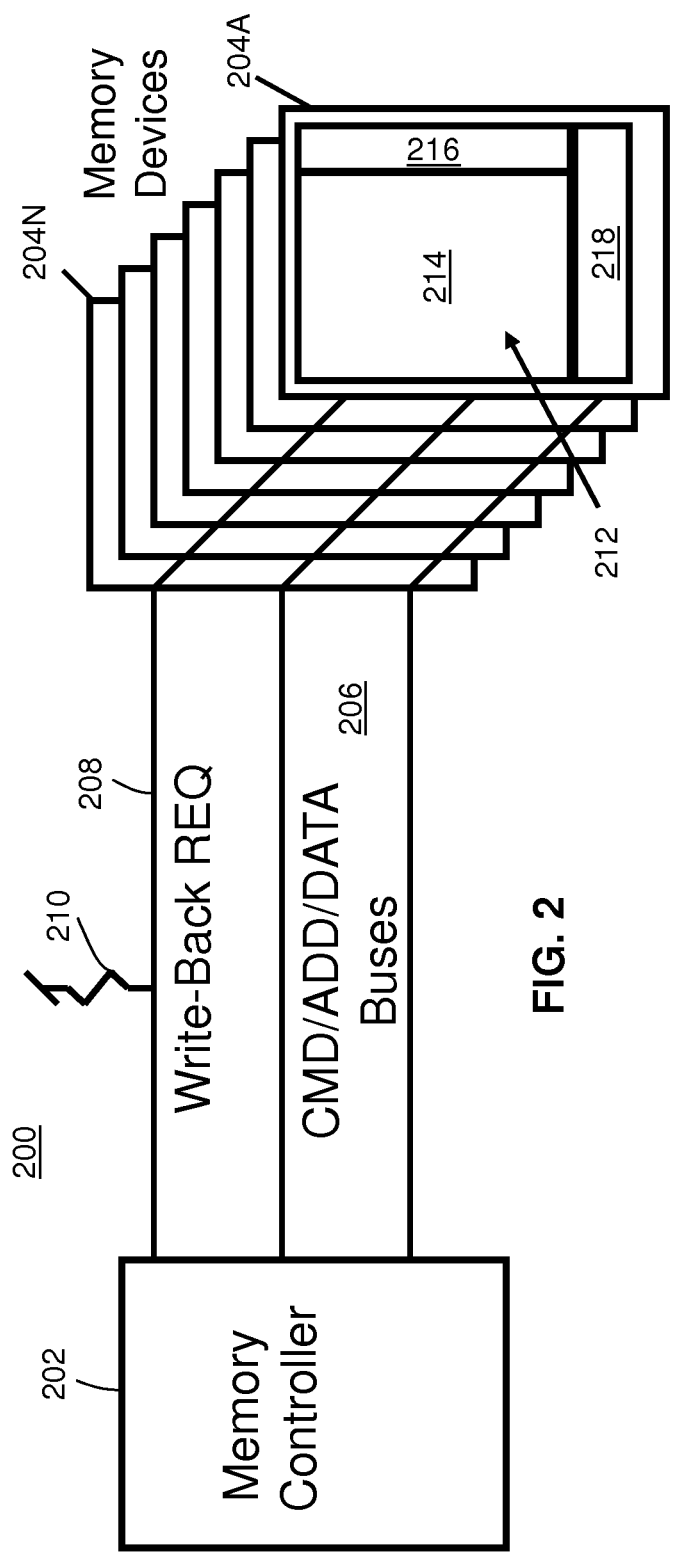
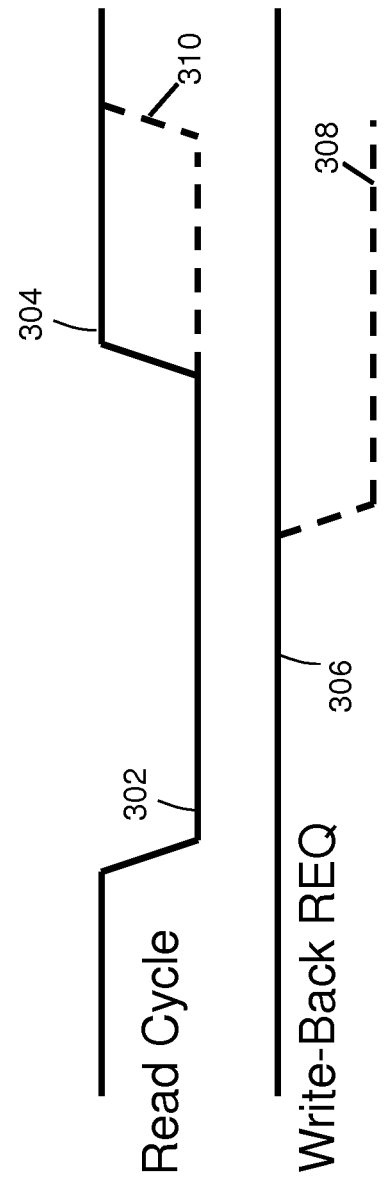
FIG. 2
FIG. 3

… … …

ADAPTIVE ERROR CORRECTION IN A MEMORY SYSTEM

DOMESTIC PRIORITY

This application is a continuation of U.S. patent application Ser. No. 14/446,922 filed Jul. 30, 2014, the content of which is incorporated by reference herein in its entirety.

BACKGROUND

The present invention relates generally to computer memory, and more particularly, to adaptive error correction in a memory system.

Computer systems often require a considerable amount of high speed memory to hold information, such as data and programs, when a computer is powered and operational. This information is normally binary, composed of patterns of 1's and 0's known as bits of data. The bits of data are typically stored in separate cells of memory devices. Current and emerging memory and storage technologies may experience single cell bit errors during a storage interval. In dynamic random access memory (DRAM) technology, these types of errors can be caused by cell leakage, alpha particle collision events, variable retention phenomena and several other means. DRAM is a type of volatile memory that uses capacitors to store bits as levels of charge. DRAM requires periodic refreshing to maintain correct charge levels within memory cells. DRAM read operations are typically destructive in that the process of reading cell values can change the charge level per cell. To restore the correct charge level as part of a read operation, a write-back operation is performed such that the intended bit state of each cell is maintained.

Current state of the art systems typically resolve memory bit errors through error correction techniques at the system level. As technology scaling results in denser memory cell counts per memory device, single cell error rates are likely to increase in memory systems.

SUMMARY

According to one embodiment, a method for adaptive error correction in a memory system includes reading data from a memory array of a non-volatile memory device in the memory system. Error correcting logic checks the data for at least one error condition stored in the memory array. Based on determining that the at least one error condition exists, a write-back indicator is asserted by the error correcting logic to request correction of the at least one error condition. Based on determining that the at least one error condition does not exist, accesses of the memory array continue without asserting the write-back indicator.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 illustrates a block diagram of a memory system operable to perform adaptive error correction in accordance with an embodiment;

FIG. 3 illustrates an example of cycle timing adjustment based on a write-back request in accordance with an embodiment;

DETAILED DESCRIPTION

An embodiment is directed to performing adaptive error correction in a memory system that includes non-volatile memory devices. Volatile memory such as DRAM may require a write-back operation after each read operation to ensure that memory cells in the DRAM are restored after a destructive read operation. Many non-volatile memory devices perform non-destructive read operations, in that reading the non-volatile memory devices does not alter the state of the memory cells. Unlike volatile memory devices, non-volatile memory can retain memory cell state values through cycling of power off-and-on. Examples of non-volatile memory devices that can incorporate embodiments as described herein include phase-change memory (PCM), magnetoresistive random-access memory (MRAM), ferro-electric RAM (FeRAM), nonvolatile static RAM (nvS-RAM), and restrictive RAM (ReRAM), as well as other non-volatile memory technologies known in the art. Non-volatile memory can degrade over time, under thermal loads, or due to other effects such that one or more memory cell values can change from a '0' to a '1' or vice versa.

In exemplary embodiments, one or more non-volatile memory devices each include localized error correcting logic to perform localized error checking prior to returning data to a memory controller. The error correcting logic can use an error-correcting code to locally correct the errant data within the non-volatile memory device. Upon checking data in the non-volatile memory device for an error, a write-back indicator can be asserted to request error correction. The write-back indicator can be sent back to a memory controller to either indicate that a write-back command must be issued or as a status of a memory device initiated write back. Where the memory device initiates the write-back locally, a current cycle time may be extended. For instance, during a read cycle, the read cycle timing can be extended by the memory device initiating the write-back. Alternatively, the memory device can internally retain the write-back indicator and upon receiving a write-back command from the memory controller, the memory device can perform a write-back if its respective write-back indicator is set.

When no error conditions are identified, the write-back indicator is not set and normal access to the memory device can continue. Thus, for cases where a read cycle is extended based on the write-back indicator being set, the extended cycle time for a write-back operation only occurs when a write-back is needed rather than performing a write-back after every read operation.

Figure 1:
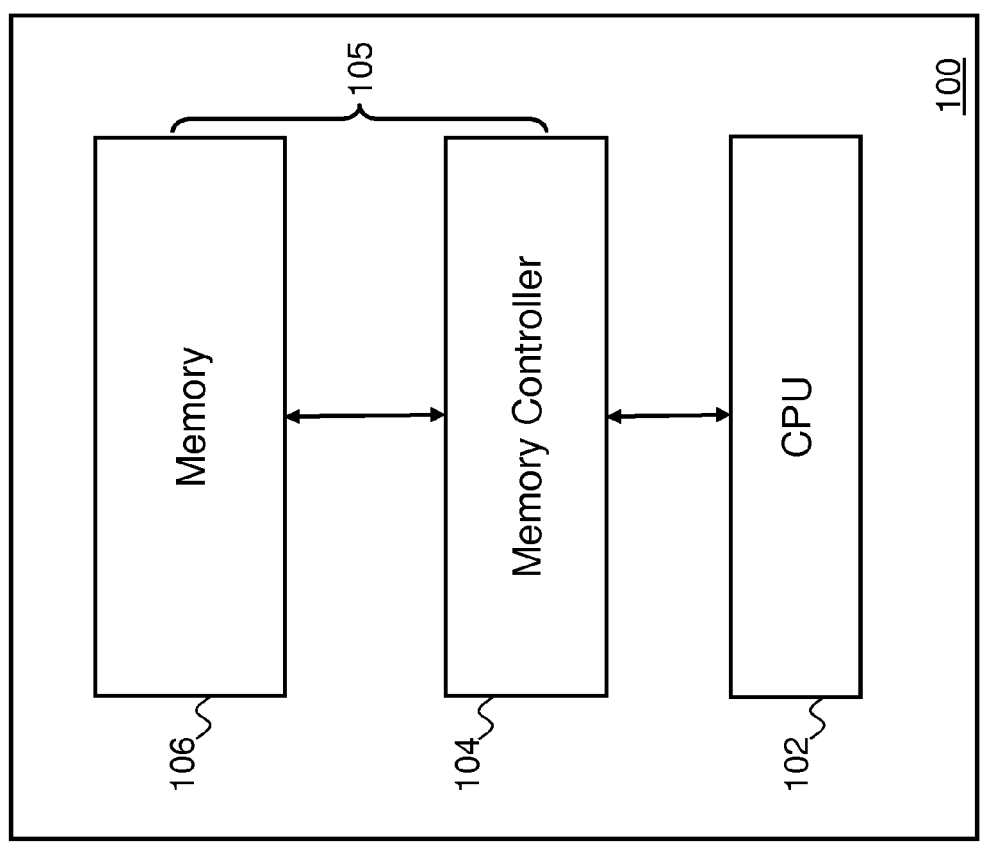
FIG. 1 illustrates a block diagram of a system operable to perform adaptive error correction in accordance with an embodiment.

FIG. 1 illustrates a block diagram of a system 100 operable to perform adaptive error correction in accordance with an embodiment. The system 100 depicted in FIG. 1 includes a computer processor 102, memory 106 including multiple non-volatile memory devices, and a memory controller 104 for receiving data from the computer processor 102 to be stored in the memory 106. Collectively, the memory controller 104 and the memory 106 are referred to as a memory system 105. In an embodiment, the non-volatile memory devices of the memory 106 are arranged into ranks or groups of non-volatile memory devices accessible at the same time.

In one embodiment the memory controller 104 is coupled to the computer processor 102 and receives write requests from the computer processor 102. The write requests contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing or retrieving data.

The system 100 is one example of a configuration that may be utilized to perform the processing described herein. Although the system 100 has been depicted with only a memory 106, memory controller 104, and computer processor 102, it will be understood that other embodiments would also operate in other systems including additional elements, e.g., multiple computers processors 102 and multiple levels of memory 106. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

FIG. 2 illustrates a block diagram of a memory system 200 operable to perform adaptive error correction in accordance with an embodiment. The memory system 200 is an embodiment of the memory system 105 of FIG. 1. In the example of FIG. 2, memory controller 202 is operably coupled to non-volatile memory devices 204A-204N. Command, address, and data buses 206 enable read and write commands to be issued from the memory controller 202 to the non-volatile memory devices 204A-204N. A write-back request 208 may be driven as a discrete signal output from the non-volatile memory devices 204A-204N as a write-back indicator to the memory controller 202. The write-back request 208 may be an open drain pull up dotted OR (indicated as pull up resistor 210) across several of the non-volatile memory devices 204A-204N. One or more of the memory devices 204A-204N can drive the write-back request 208 by asserting a write-back indicator based on detecting at least one error condition stored in a memory array 212. Each of the non-volatile memory devices 204A-204N can include a memory array 212 that stores data 214 and check data 216. The check data 216 may be error-correcting code (ECC) check data that can be used by error correcting logic 218 in each of the non-volatile memory devices 204A-204N to detect and correct errors. For example, the error correcting logic 218 can compute an error-correcting code of the data 214 read from the memory array 212 and read check data 216 from the memory array 212. A mismatch between the error-correcting code computed upon reading the data 214 and the check data 216 read from the memory array 212 can identify an error. This results in asserting a write-back indicator that drives the write-back request 208.

The check data 216 can be used to compute a corrected version of the data 214 to report back to the memory controller 202 and to be written back to the memory array 212. The data 214 and check data 216 can include any number of individual cells or bits. A write-back operation can be performed on an individual memory device basis such that any of the non-volatile memory devices 204A-204N identifying an error can correct respective data 214. Error detection and correction on write-back can be performed on a word basis, a page basis, a bank basis, or any subdivision unit basis within each of the non-volatile memory devices 204A-204N. When a memory device, such as non-volatile memory device 204A, determines that a write-back is needed while performing a read cycle, the non-volatile memory device 204A can assert the write-back request 208 while performing the write-back of the corrected data. This may result in extending the current cycle time at the memory controller 202.

FIG. 3 illustrates an example of cycle timing adjustment based on a write-back request in accordance with an embodiment. FIG. 3 is described with further reference to FIG. 2. The memory controller 202 initiates a read cycle by driving a read cycle signal of the buses 206 to a low state 302 (i.e., asserted in this example). Under normal operating conditions, when no error is detected by the error correcting logic 218, then the write-back indicator is not asserted on the write-back request 208, the data 214 is returned to the memory controller 202, and normal operation continues where further accesses of the memory array 212 can be made on subsequent commands. A read cycle normally ends at a predictable time, and the memory controller 202 sets the read cycle to a high state 304 (i.e., not asserted in this example) after a predetermined cycle time interval. If the error correcting logic 218 detects at least one error condition upon reading the memory array 212 in response to a read command, the error correcting logic 218 can assert a write-back indicator that drives the write-back request 208 from a high state 306 (i.e., not asserted in this example) to a low state 308 (i.e., asserted in this example). Assertion of the write-back request 208 can result in extending cycle timing of the read cycle which time shifts a transition 310 between the low state 302 and high state 304 of the read cycle. Since the cycle time extension only occurs on detected error conditions resulting in a write-back, the additional read cycle completion latency is only occasionally incurred rather than performing a write-back as part of every read operation.

Figure 4:
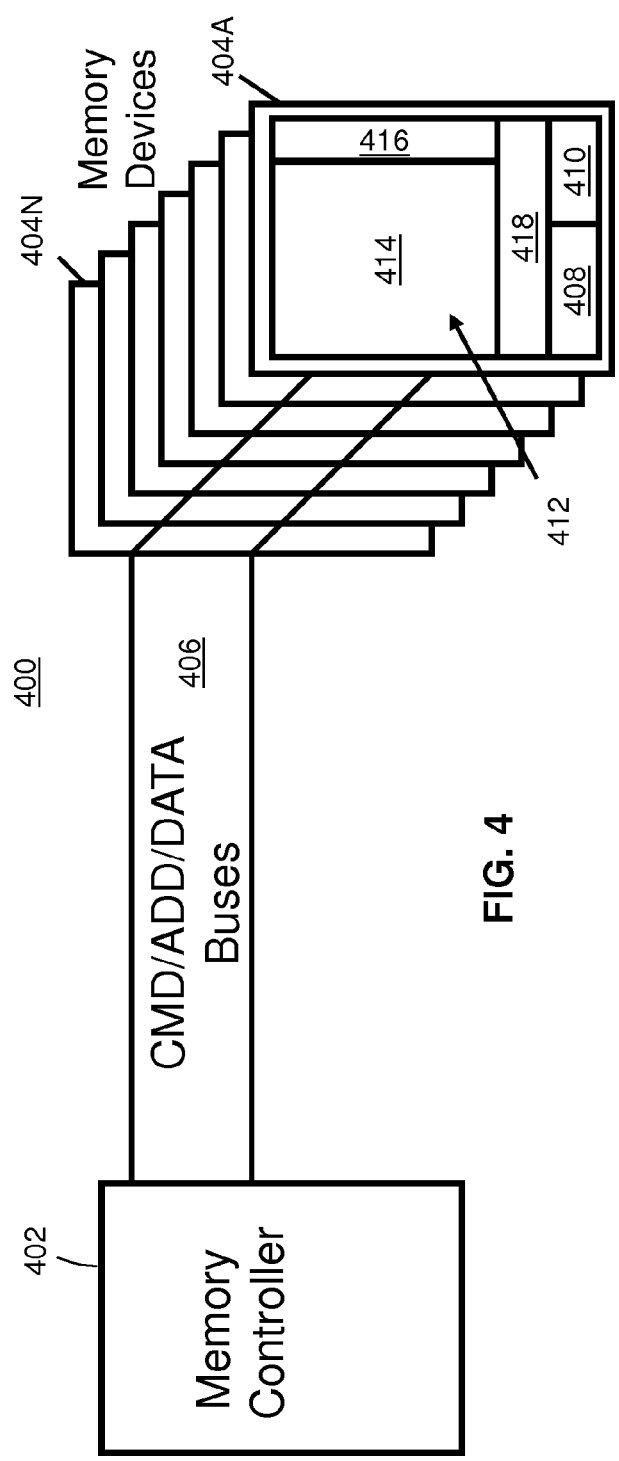
FIG. 4 illustrates another example of a block diagram of a memory system operable to perform adaptive error correction in accordance with an embodiment.

FIG. 4 illustrates another example of a block diagram of a memory system 400 operable to perform adaptive error correction in accordance with an embodiment. Similar to the memory system 200 of FIG. 2, the memory system 400 of FIG. 4 is an embodiment of the memory system 105 of FIG. 1 and includes a memory controller 402 operably coupled to non-volatile memory devices 404A-404N. Command, address, and data buses 406 enable read and write commands to be issued from the memory controller 402 to the non-volatile memory devices 404A-404N. Rather than providing a separate write-back request, such as the write-back request 208 of FIG. 2, the memory system 400 does not include a dedicated discrete output to be driven in response to a write-back indicator 408 generated by one or more of the non-volatile memory devices 404A-404N.

Each of the non-volatile memory devices 404A-404N can include a memory array 412 that stores data 414 and check data 416. The check data 416 may be error-correcting code (ECC) check data that can be used by error correcting logic 418 in each of the non-volatile memory devices 404A-404N to detect and correct errors. For example, the error correcting logic 418 can compute an error-correcting code of the data 414 read from the memory array 412 and read check data 416 from the memory array 412. A mismatch between the error-correcting code calculated upon reading the data 414 and the check data 416 read from the memory array 412 can identify an error. This results in asserting the write-back indicator 408. A write-back buffer 410 may be included in each of the non-volatile memory devices 404A-404N to store a corrected version of the data 414 as write-back data. The write-back data can be written from the write-back buffer 410 to the memory array 412 based on receiving a write-back command from the memory controller 402. In an embodiment where the write-back indicator 408 is not reported to the memory controller 402, the memory controller 402 can periodically issue a write back command to the non-volatile memory devices 404A-404N. In an alternate embodiment, the write-back indicator 408 is sent to the memory controller 402 as an encoded message, such as a bit in a read data burst. Since the non-volatile memory devices 404A-404N buffer the write-back data, the memory controller 402 need not respond immediately to the write-back indicator 408 but can schedule a write-back command for a future time.

Figure 5:
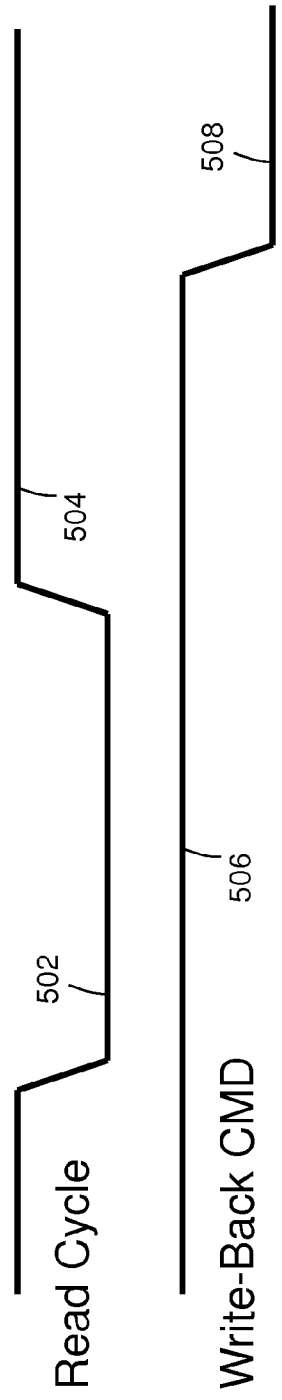
FIG. 5 illustrates an example of write back command timing relative to a read cycle in accordance with an embodiment.

FIG. 5 illustrates an example of write-back command timing relative to a read cycle in accordance with an embodiment. FIG. 5 is described in reference to FIG. 4. The memory controller 402 initiates a read cycle by driving a read cycle signal of the buses 406 to a low state 502 (i.e., asserted in this example). Regardless of whether or not the write-back indicator 408 is asserted the timing of the read cycle remains consistent, and the memory controller 402 sets the read cycle to a high state 504 (i.e., not asserted in this example) after a predetermined cycle time interval. In the example of FIG. 5 as the read cycle transitions between the low state 502 and the high state 504, a write-back command of the buses 406 remains at a high state 506 (i.e., not asserted in this example). At some future time when the read cycle is at the high state 504, the memory controller 402 sends the write-back command to the non-volatile memory devices 404A-404N by driving the write-back command to a low state 508 (i.e., asserted in this example). This triggers any of the non-volatile memory devices 404A-404N having an asserted write-back indicator 408 to update data 414 in each respective memory array 412 with write-back data from the respective write-back buffer 410.

Figure 6:
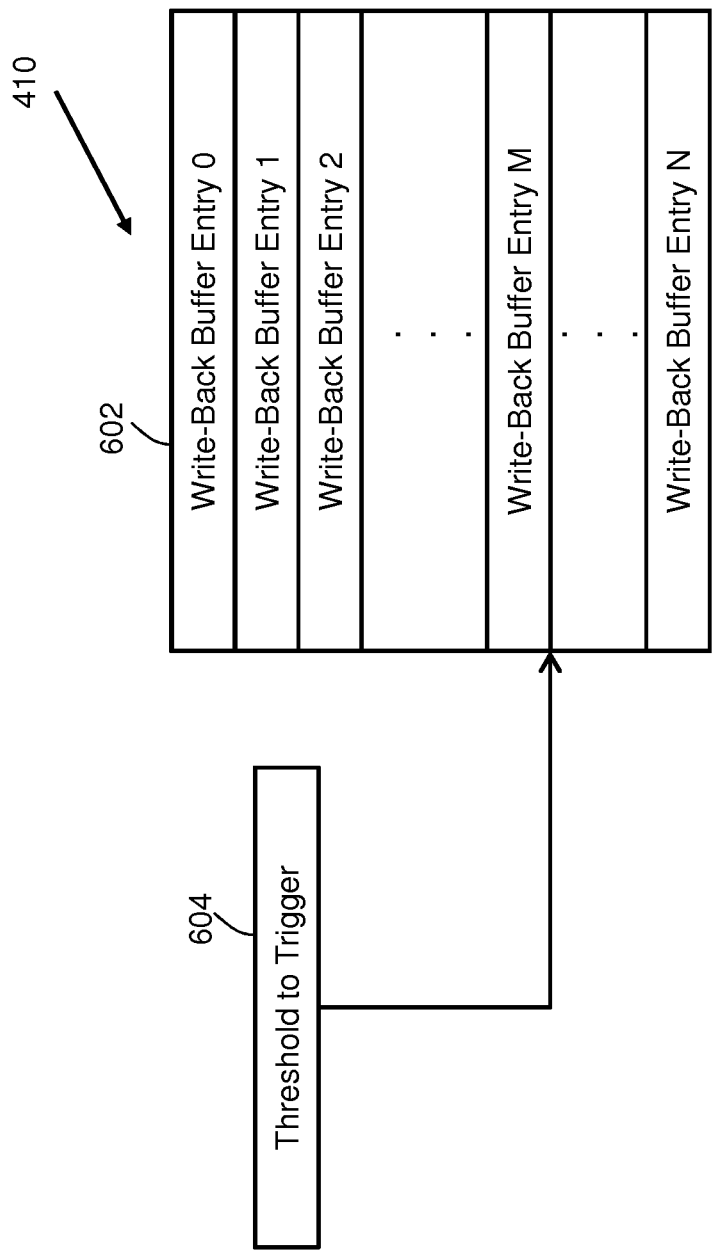
FIG. 6 illustrates an example of multiple write-back buffer entries and an associated threshold in accordance with an embodiment.

FIG. 6 illustrates an example of multiple write-back buffer entries 602 and an associated threshold 604 in accordance with an embodiment. With continued reference to FIG. 4, the write-back buffer 410 can include multiple write-back buffer entries 602 associated with addresses that resulted in an errant read. Rather than immediately notifying the memory controller 402 when at least one write-back is needed, the threshold 604 can be used to define a threshold number of the write-back buffer entries 602 to populate before notifying the memory controller 402 that a write-back is needed. In the example of FIG. 6, the threshold 604 is set to trigger notification upon populating write-back buffer entry number 'M', where 'M' is a number between a first entry number (i.e., entry 0) and a maximum entry number (i.e., entry N). Setting the threshold 604 to an intermediate value allows more time to elapse between write-back operations while leaving one or more additional buffer entries available should the memory controller 402 delay scheduling of the write-back command. The threshold 604 can be configurable as part of a mode register to any value between '0' and 'N' in the example of FIG. 6.

In one embodiment, when a read command is issued to the same address as one of the write-back buffer entries 602, then the read data is returned from the corresponding write-back buffer entry 602. Similarly, when a write command is issued to the same address as one of the write-back buffer entries 602, then the write data can be written directly written to the memory and the corresponding write back buffer entry 602 can be cleared.

Figure 7:
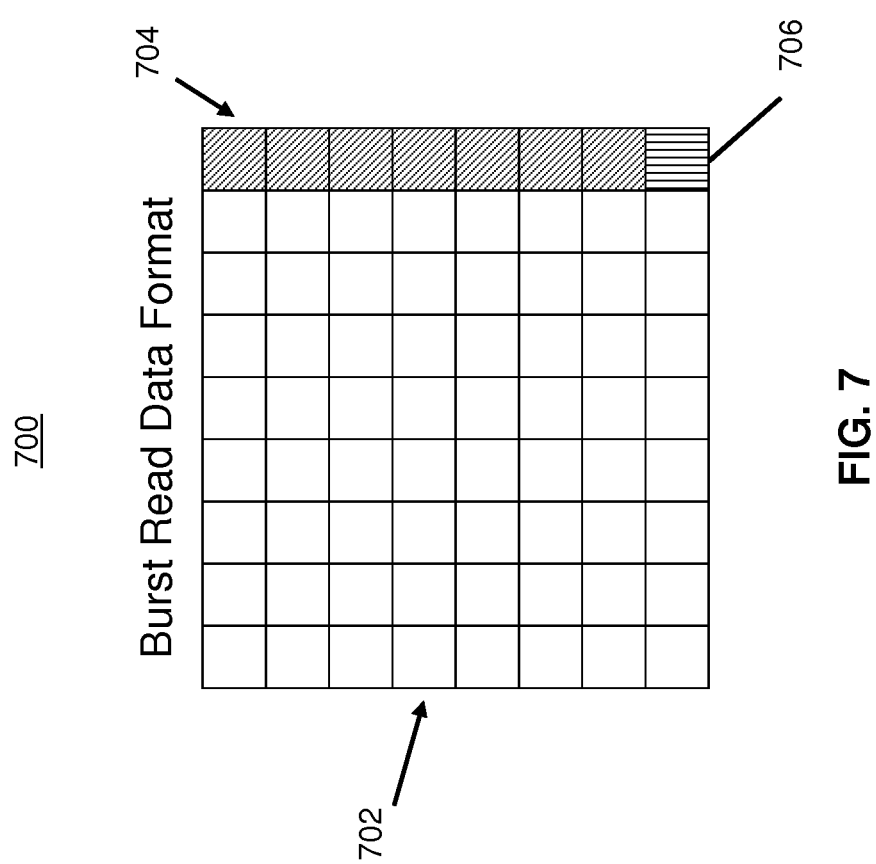
FIG. 7 illustrates an example of a burst read data format in accordance with an embodiment.

FIG. 7 illustrates an example of a burst read data format 700 in accordance with an embodiment. The burst read data format 700 is an example where read data 702, check data 704, and a write-back indicator 706 can be sent in response to a burst read command. With respect to the example of FIG. 4, the burst read data format 700 allows the write-back indicator 408 to be encoded and sent on buses 406 as the write-back indicator 706. When there are no errors in the data 414 of FIG. 4, the read data 702 in the burst read data format 700 is a copy of a number of bits from the data 414. When there is an error, the read data 702 can be a corrected version of the data 414. The check data 704 can be copied from the check data 416 of FIG. 4 or generated for the particular sizing of the burst read data format 700. For instance, the check data 704 can be cyclic redundancy check (CRC) bits, data bus inversion (DBI) bits, ECC bits, or another error checking format known in the art.

Figure 8:
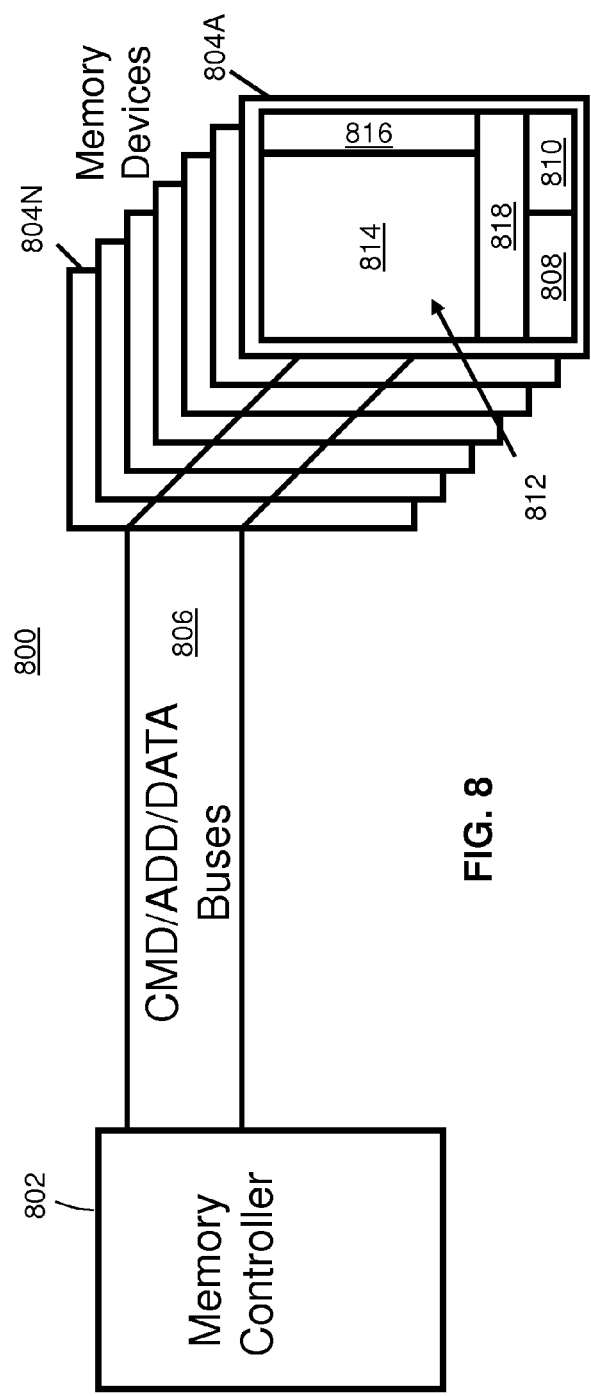
FIG. 8 illustrates another example of a block diagram of a memory system operable to perform adaptive error correction in accordance with an embodiment.

FIG. 8 illustrates another example of a block diagram of a memory system 800 operable to perform adaptive error correction in accordance with an embodiment. Similar to the memory system 400 of FIG. 4, the memory system 800 of FIG. 8 is an embodiment of the memory system 105 of FIG. 1 and includes a memory controller 802 operably coupled to non-volatile memory devices 804A-804N. Command, address, and data buses 806 enable read and write commands to be issued from the memory controller 802 to the non-volatile memory devices 804A-804N.

Each of the non-volatile memory devices 804A-804N can include a memory array 812 that stores data 814 and check data 816. The check data 816 may be error-correcting code (ECC) check data that can be used by error correcting logic 818 in each of the non-volatile memory devices 804A-804N to detect and correct errors. For example, the error correcting logic 818 can compute an error-correcting code of the data 814 read from the memory array 812 and read check data 816 from the memory array 812 as part of a write verify operation. A mismatch between the error-correcting code calculated upon reading the data 814 and the check data 816 read from the memory array 812 can identify an error. This results in asserting the write-back indicator 808. A write retry buffer 810 may be included in each of the non-volatile memory devices 804A-804N to store write data to be written to the memory array 812 based on receiving a write command from the memory controller 802. The write data can be written from the write retry buffer 810 to the memory array 812 when executing a write command from the memory controller 802. Reading of the data 814 from the memory array 812 can be performed as a write verify operation, where correction of at least one error condition is performed as a write retry operation.

Rather than using the check data 816 for write verification, the write verification may be performed by attempting to store write data from the write retry buffer 810, reading the data 814 after the write operation, and comparing the data 814 read from the memory array 812 to the write data in the write retry buffer 810 to confirm that no bit differences are detected. In one embodiment, the memory system 400 of FIG. 4 and the memory system 800 are the same, where the write-back buffer 410 of FIG. 4 also functions as the write retry buffer 810 of FIG. 8.

In an embodiment where the write-back indicator 808 is not reported to the memory controller 802, the memory controller 802 can periodically issue a write retry command to the non-volatile memory devices 804A-804N. In an alternate embodiment, the write-back indicator 808 is sent to the memory controller 802 as an encoded message, such as a bit in a data burst. Since the non-volatile memory devices 804A-804N buffer the write data, the memory controller 802 need not respond immediately to the write-back indicator 808 but can schedule a write retry command for a future time.

Figure 9:
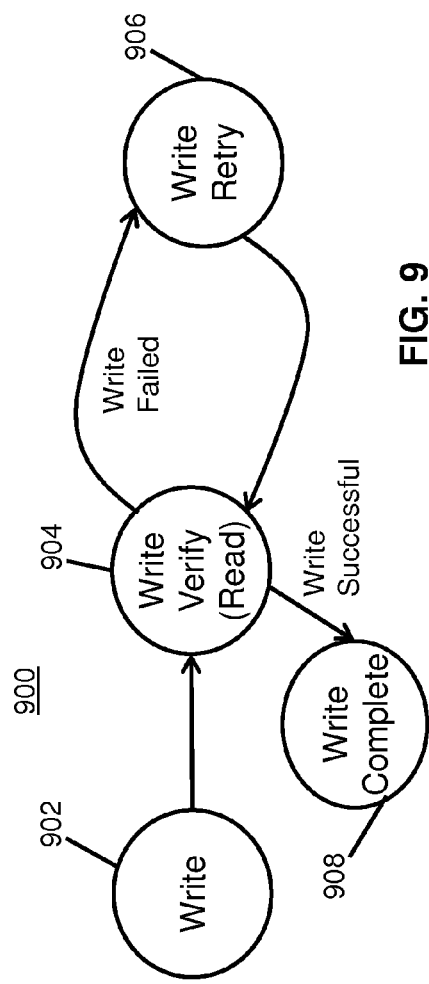
FIG. 9 illustrates an example of a state transition diagram for a write operation in accordance with an embodiment.

FIG. 9 illustrates an example of a state transition diagram 900 for a write operation in accordance with an embodiment. FIG. 9 is described with continued reference to FIG. 8. When a write command is received the non-volatile memory devices 804A-804N at write state 902, the non-volatile memory devices 804A-804N transition to a write verify state 904 to read the memory array 812 and confirm that the write was successful. If the write failed, the non-volatile memory devices 804A-804N transition to a write retry state 906 to attempt the write again using write data in the write retry buffer 810. After attempting a write retry, the non-volatile memory devices 804A-804N return to the write verify state 904. If at the write verify state 904 the write is deemed successful, the non-volatile memory devices 804A-804N transition to a write complete state 908 and further read/write operations can be performed. The state transitions in the state transition diagram 900 can be driven by the memory controller 802 or internally managed within the non-volatile memory devices 804A-804N.

Figure 10:
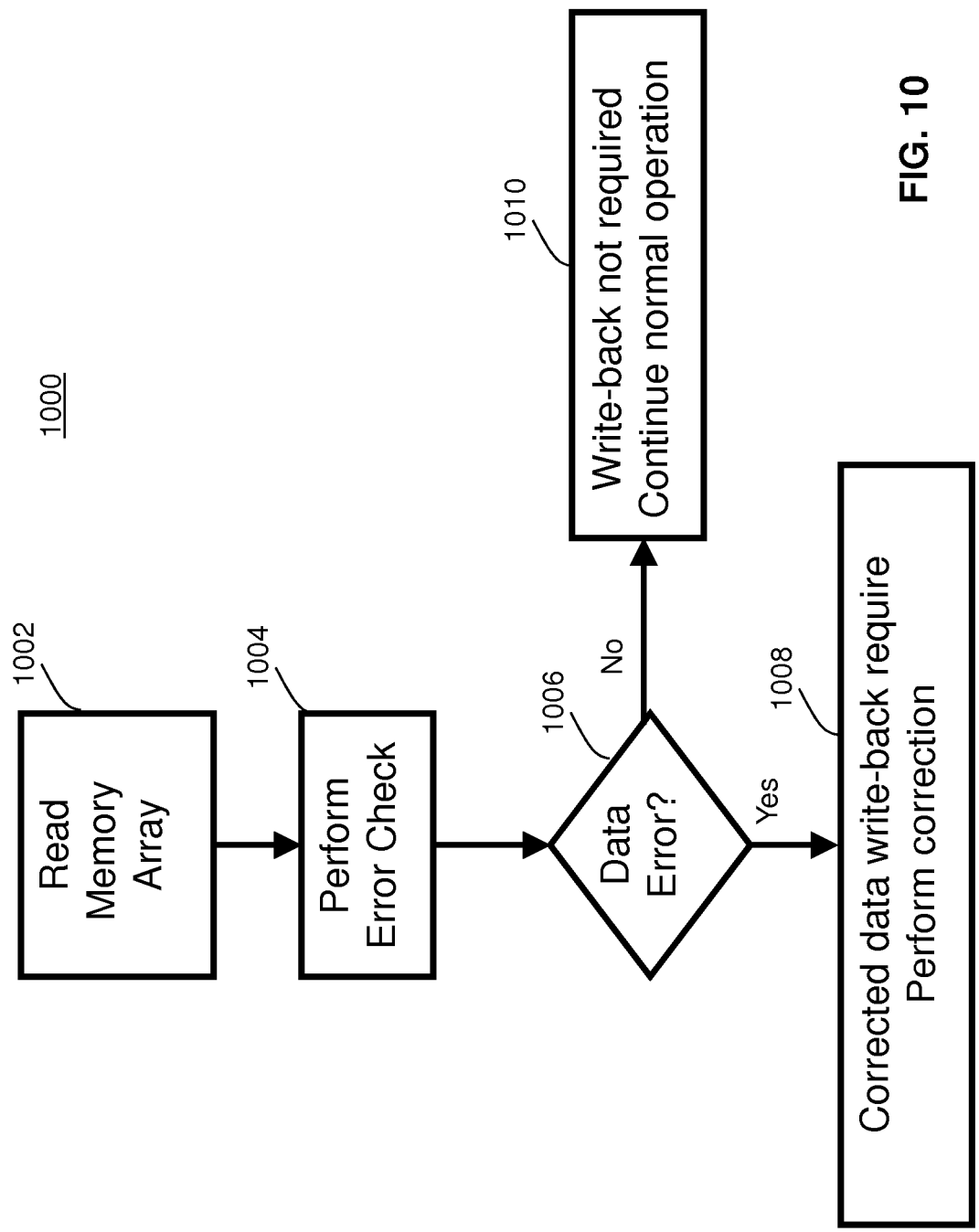
FIG. 10 illustrates a flow diagram of a method for performing adaptive error correction in a memory system in accordance with an embodiment.

FIG. 10 illustrates a flow diagram of a method 1000 for performing adaptive error correction in accordance with an embodiment. The depicted blocks may be part of or in addition to another process and/or may be performed in any suitable order to provide adaptive error correction. The method 1000 can be implemented for a variety of memory system configurations and is described in reference to FIGS. 1-10. For instance, the method 1000 can be performed by non-volatile memory devices 204A-N, 404A-N, and/or 804A-N.

At block 1002, data are read from a memory array of a non-volatile memory device in a memory system, such as data 214 from memory array 212 of non-volatile memory device 202A in memory system 200. At block 1004, error correcting logic, such as error correcting logic 218, can check the data for at least one error condition stored in the memory array. For example, an error-correcting code of the data 214 can be computed and error-correcting code check data 216 may be read from the memory array 212. The error correcting logic 218 can identify that the at least one error condition exists based on a mismatch between the error-correcting code of the data 214 and the error-correcting code check data 216 from the memory array 212. The error-correcting code check data 216 read from the memory array 212 can be used to generate a corrected version of the data 214 to write-back to the memory array 212 at a desired time.

At block 1006, it is determined whether at least one error condition exists in the data read from the memory array. At block 1008, based on determining that the at least one error condition exists, a write-back indicator is asserted by the error correcting logic to request correction of the at least one error condition. For example, the error correcting logic 218 can cause the write-back request 208 to be driven to a low state 308 (i.e., asserted) to notify the memory controller 202 of the write-back. At block 1010, based on determining that the at least one error condition does not exist, accesses of the memory array continue without asserting the write-back indicator. Thus, read cycle timing of transition 310 need not be modified where no write-back is needed.

As in the example of FIG. 2, a write-back indicator can be sent from one or more of the non-volatile memory devices 204A-204N to the memory controller 202 of the memory system 200 as a discrete signal output, e.g., write-back request 208. Alternatively, as in the example of FIG. 7, the write-back indicator 706 can be encoded as a bit that is embedded in burst read data returned to the memory controller from the non-volatile memory device in response to a read command. A non-volatile memory device can extend cycle timing monitored by the memory controller while the write-back indicator is asserted, such as a read cycle or write verify cycle.

In an embodiment that includes a write-back buffer in a non-volatile memory device, such as write-back buffer 410 of FIG. 4, a corrected version of the data can be stored as write-back data in the write-back buffer. The corrected version of the data can change the state of one or more flipped bits using known error correction algorithms in combination with the error-correcting code check data from the memory array. Based on receiving a write-back command from the memory controller, the write-back data can be written to the memory array. Alternatively, the non-volatile memory device can determine when to perform the write-back. The write-back buffer can include multiple write-back buffer entries. The non-volatile memory device may notify the memory controller that a write-back is needed based on determining that a threshold number of write buffer entries is populated, such as threshold 604 relative to the write-back buffer entries 602 of FIG. 6. The non-volatile memory device can then wait for the memory controller to respond with the write-back command prior to writing the write-back data to the memory array.

In one embodiment, a non-volatile memory device can include a write retry buffer, such as the write retry buffer 810 of FIG. 8, to support rewrite operations on a write failure. Write data can be saved into a write retry buffer based on receiving a write command for the non-volatile memory device. A write of the write data can be executed to store the write data in the memory array. The reading of the data from the memory array can be performed as a write verify operation, where correction of the at least one error condition is performed as a write retry operation. A write retry can be initiated as needed or periodically by the memory controller.

Technical effects include performing adaptive error correction in a memory system by detecting when a write-back is needed on an error condition adaptively responding by extending a read or write verify cycle to correct the error, providing notification of the need for the write-back to a memory controller, and/or responding to a write-back command if a write-back indicator is set.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for adaptive error correction in a memory system, the method comprising:
   reading data from a memory array of a non-volatile memory device in the memory system;
   checking, by error correcting logic, the data for at least one error condition stored in the memory array;
   based on determining that the at least one error condition exists, asserting a write-back indicator, by the error correcting logic, to request correction of the at least one error condition;
   based on determining that the at least one error condition does not exist, continuing accesses of the memory array without asserting the write-back indicator;
   saving write data into a write retry buffer based on receiving a write command for the non-volatile memory device;
   executing a write of the write data to store the write data in the memory array; and
   performing the reading of the data from the memory array as a write verify operation, wherein correction of the at least one error condition is performed as a write retry operation.

2. The method of claim 1, wherein determining that the at least one error condition exists comprises:
   computing an error-correcting code of the data;
   reading error-correcting code check data from the memory array; and
   identifying that the at least one error condition exists based on a mismatch between the error-correcting code of the data and the error-correcting code check data from the memory array.

3. The method of claim 1, further comprising:
   sending the write-back indicator from the non-volatile memory device to a memory controller of the memory system.

4. The method of claim 3, wherein the write-back indicator is a discrete signal output by the non-volatile memory device, and the non-volatile memory device extends cycle timing monitored by the memory controller while the write-back indicator is asserted.

5. The method of claim 3, wherein the write-back indicator is embedded in burst read data returned to the memory controller from the non-volatile memory device in response to a read command.

6. The method of claim 1, further comprising:
   storing a corrected version of the data as write-back data in a write-back buffer; and
   writing the write-back data to the memory array based on receiving a write-back command from a memory controller.

7. The method of claim 6, wherein the write-back buffer comprises multiple write-back buffer entries, and the method further comprising:
   notifying the memory controller that a write-back is needed based on determining that a threshold number of write buffer entries is populated; and
   waiting for the memory controller to respond with the write-back command prior to writing the write-back data to the memory array.

* * * * *